United States Patent
Wu et al.

(10) Patent No.: US 12,294,458 B2
(45) Date of Patent: May 6, 2025

(54) DATA PROCESSING METHOD AND DEVICE IN PASSIVE OPTICAL NETWORK SYSTEM

(71) Applicant: Huawei Technologies Co., Ltd., Shenzhen (CN)

(72) Inventors: Xuming Wu, Wuhan (CN); Xu Wang, Wuhan (CN); Dekun Liu, Wuhan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/192,121

(22) Filed: Mar. 29, 2023

(65) Prior Publication Data

US 2023/0246741 A1 Aug. 3, 2023

Related U.S. Application Data

(63) Continuation of application No. PCT/CN2021/119755, filed on Sep. 23, 2021.

(30) Foreign Application Priority Data

Sep. 30, 2020 (CN) .......................... 202011063398.5

(51) Int. Cl.
  *H04L 1/00* (2006.01)
  *H04L 7/00* (2006.01)
  *H04Q 11/00* (2006.01)

(52) U.S. Cl.
  CPC .......... *H04L 1/0071* (2013.01); *H04L 1/0057* (2013.01); *H04L 7/0075* (2013.01); *H04Q 11/0062* (2013.01)

(58) Field of Classification Search
  CPC ... H03M 13/27; H03M 13/333; H04L 1/0041; H04L 1/0057; H04L 1/0071; H04L 7/041
  See application file for complete search history.

(56) References Cited

U.S. PATENT DOCUMENTS

| 5,430,767 A | * | 7/1995 | Min ..................... H04L 7/042 714/775 |
| 5,796,755 A | | 8/1998 | Shon |

(Continued)

FOREIGN PATENT DOCUMENTS

| CN | 1449191 A | 10/2003 |
| CN | 102013910 A | 4/2011 |

(Continued)

OTHER PUBLICATIONS

Dusan Suvakovic et al, "Low Energy Bit-Interleaving Downstream Protocol for Passive Optical Networks," Online Conference on Green Communication (GreenCom), 2012 IEEE, Sep. 25, 2012 (Sep. 25, 2012), pp. 26-31, XP032410985.

*Primary Examiner* — Albert Decady
*Assistant Examiner* — Enamul M Kabir
(74) *Attorney, Agent, or Firm* — SLATER MATSIL, LLP

(57) ABSTRACT

A data processing method including receiving a data flow sent by an encoder side, where the data flow is a bit stream on which interleaving encoding is used, the data flow includes synchronization information, and the synchronization information is distributed in the data flow based on a first permutation interval, obtaining, from the data flow, first data information based on a first value interval and a first value length, where the first value interval is equal to the first permutation interval, and a difference between the first value length and a length of the synchronization information is less than or equal to a preset error value, and when a similarity between the first data information and the synchronization information exceeds a preset similarity threshold, performing de-interleaving on the data flow based on a start location of the first data information.

21 Claims, 4 Drawing Sheets

(56) References Cited

U.S. PATENT DOCUMENTS

| | | | | |
|---|---|---|---|---|
| 5,835,165 | A | * | 11/1998 | Keate .................... H04L 1/0057 714/775 |
| 2006/0050884 | A1 | * | 3/2006 | O'Brien ................. H04L 7/042 380/255 |
| 2015/0081311 | A1 | * | 3/2015 | Haywood ........ H04N 21/23892 704/500 |
| 2020/0295870 | A1 | * | 9/2020 | Jing ................... H04Q 11/0067 |
| 2021/0184771 | A1 | * | 6/2021 | Strobel .................. H04L 1/004 |
| 2021/0219033 | A1 | * | 7/2021 | Lefevre ................ H04L 1/0071 |
| 2023/0198670 | A1 | * | 6/2023 | Strobel ................ H04L 1/0057 370/310 |

FOREIGN PATENT DOCUMENTS

| | | |
|---|---|---|
| CN | 106331908 A | 1/2017 |
| CN | 110192350 A | 8/2019 |
| GB | 2409792 A | 7/2005 |

\* cited by examiner

DATA PROCESSING METHOD AND DEVICE IN PASSIVE OPTICAL NETWORK SYSTEM

CROSS-REFERENCE TO RELATED APPLICATIONS

This application is a continuation of International Application No. PCT/CN2021/119755, filed on Sep. 23, 2021, which claims priority to Chinese Patent Application No. 202011063398.5, filed on Sep. 30, 2020. The disclosures of the aforementioned applications are hereby incorporated by reference in their entireties.

TECHNICAL FIELD

This application relates to the field of communication technologies, and in particular, to a data processing method and device in a passive optical network system.

BACKGROUND

A passive optical network (PON) system may include an optical line terminal (OLT) located at a central office end and an optical network unit (ONU) on a user side and an optical distribution network (ODN). The OLT provides a network-side interface for the PON system, and is connected to one or more ODNs. The ONU provides a user-side interface for the PON system, and the ONU is connected to the ODN.

In the PON system, data transmission from the OLT to the ONU is referred to as downlink transmission, and data transmission from the ONU to the OLT is referred to as uplink transmission. In the PON system, an uplink working clock and a transmit slot of the ONU need to be obtained from a downlink data flow. After being powered on, the ONU enters the first working state. In this working state, the ONU needs to perform downlink data frame synchronization. In this process, the ONU needs to implement downlink clock synchronization, downlink data flow synchronization, and downlink data frame synchronization.

A current PON system has a plurality of implementation forms, for example, a current XG(S)PON system, a current 10 G EPON system, and a 2*25 G EPON system, and different PON systems use different data processing mechanisms and different downlink synchronization mechanisms. With continuous evolution of the PON system, a higher-speed PON system, for example, a 50 G PON system, will emerge. In the high-speed PON system, there may be a problem of bit error diffusion and a problem that downlink synchronization cannot be performed.

SUMMARY

Embodiments of this application provide a data processing method and device in a passive optical network system, to resolve a problem of bit error diffusion in a high-speed PON system and implement downlink synchronization in the high-speed PON system.

To resolve the foregoing technical problem, embodiments of this application provide the following technical solutions.

According to a first aspect, an embodiment of this application provides a data processing method in a passive optical network system. The method includes receiving a data flow sent by an encoder side, where the data flow is a bit stream on which interleaving encoding is used, the data flow includes synchronization information, and the synchronization information is distributed in the data flow based on a first permutation interval, obtaining, from the data flow, first data information based on a first value interval and a first value length, where the first value interval is equal to the first permutation interval, and a difference between the first value length and a length of the synchronization information is less than or equal to a preset error value, and when a similarity between the first data information and the synchronization information exceeds a preset similarity threshold, performing de-interleaving on the data flow based on a start location of the first data information. In the foregoing embodiment of this application, the synchronization information and a data block in the data flow sent by the encoder side are interleaved together, and the synchronization information is distributed at intervals in the data flow. Therefore, the data flow may be sampled based on the first value interval and the value length, to obtain the first data information. The first data information is obtained by obtaining a value from the data flow based on the value length, and the first data information is obtained by obtaining a value from the data flow based on the value interval. When the similarity between the first data information and the synchronization information exceeds the similarity threshold, the start location of the first data information may be used to perform de-interleaving on the data flow, so that the synchronization information in the data flow can finally be obtained. This embodiment of this application is applicable to a scenario of interleaving encoding of a data flow in a high-speed PON system, and resolves a problem that downlink synchronization cannot be determined when the interleaving encoding is used for the data flow.

In a possible implementation, the obtaining, from the data flow, first data information based on a first value interval and a first value length includes obtaining, from the data flow, a first data substream whose length is P×N bits, where P is the length of the synchronization information, N is a quantity of code blocks on which the interleaving encoding is performed, and the code block includes at least one codeword, and obtaining, from the first data substream based on the first value interval and the first value length, first data information including P-bit data, where the value interval is (N−1)×k bits, k is a granularity of the interleaving encoding, and × represents a multiplication operation. In the foregoing embodiment of this application, the decoder side obtains k-bit data from the first data substream at a time based on an interval corresponding to the first value interval, or may obtain k-bit data from the first data substream for a plurality of times based on the first value interval. Therefore, the P-bit data can be obtained by concatenating all the obtained k-bit data. For example, the value interval is the (N−1)×k bits, and k-bit data is taken out at an interval of "(N−1)×k bits". Then, all the obtained k-data may be combined together to obtain first data information with P bits. The first data information may be used to determine whether the first data information is similar to the synchronization information. In this embodiment of this application, the decoder side may obtain the first data information whose length is the same as the synchronization information in the foregoing manner.

In a possible implementation, the obtaining, from the first data substream based on the first value interval and the first value length, first data information including P-bit data includes dividing the first data substream into P/k data sets, where each data set includes N×k-bit data, and / represents a division operation, and obtaining k-bit data from each of the P/k data sets, where the first data information includes a total of P-bit data obtained from the P/k data sets. In the foregoing embodiment of this application, after the decoder side determines the P/k data sets, k-bit data is obtained from each data set. In this case, for the P/k data sets, a total of P-bit data may be obtained, and the P-bit data constitutes the foregoing first data information. The length of the first data information is P bits. In this embodiment of this application, the decoder side may obtain the first data information whose length is the same as the synchronization information in the foregoing manner.

In a possible implementation, when the similarity between the first data information and the synchronization information does not exceed the similarity threshold, the method further includes obtaining, from the data flow, a second data substream whose length is P×N bits, where data of at least one different bit exists in the second data substream and the first data substream, obtaining, from the second data substream based on the first value interval and the first value length, second data information including P-bit data, and when a similarity between the second data information and the synchronization information exceeds the similarity threshold, performing de-interleaving on the data flow based on a start location of the second data information. In the foregoing embodiment of this application, the decoder side uses a polling processing manner. When the similarity between the first data information and the synchronization information exceeds the similarity threshold, the synchronization information is obtained from the data flow. When the similarity between the first data information and the synchronization information does not exceed the similarity threshold, the synchronization information is obtained from the data flow. Similarly, if it is determined that the similarity between the second data information and the synchronization information does not exceed the similarity threshold, the decoder side may further obtain a third data substream from the data flow until data information similar to the synchronization information is obtained.

In a possible implementation, after the performing de-interleaving on the data flow based on a start location of the first data information, the method further includes determining that the start location of the first data information is the $1^{st}$ bit in the first data information, and using the $1^{st}$ bit as a start boundary of the downlink synchronization, and performing forward error correction (FEC) decoding on the data flow. In the foregoing embodiment of this application, after the decoder side de-interleaves the data flow based on the start location of the first data information, the decoder side determines that the start location of the first data information is the $1^{st}$ bit in the first data information, in other words, the decoder side finds the $1^{st}$ bit in the first data information. The $1^{st}$ bit is delimitation for the decoder side to perform downlink synchronization. The decoder side uses the $1^{st}$ bit as the start boundary of the downlink synchronization, and performs FEC decoding on the data flow, so that the decoder side performs FEC decoding on the received data flow. Therefore, the decoder side may obtain the original data block that exists before the encoder side performs FEC encoding, and the decoder side obtains content of the data block transmitted by the encoder side.

In a possible implementation, where after the using the $1^{st}$ bit as a start boundary of the downlink synchronization, and performing FEC decoding on the data flow, the method further includes if the FEC decoding performed on the data flow succeeds, determining that the $1^{st}$ bit in the first data information is the start boundary of the downlink synchronization. In the foregoing embodiment of this application, the FEC decoding performed by the decoder side may be implemented by using an FEC decoder. The FEC decoder may output a flag indicating whether the decoding succeeds. If the FEC decoding performed on the data flow succeeds, it indicates that the $1^{st}$ bit of the first data information that is determined by the decoder side and used as the start location of the synchronization information is correct. In this case, the decoder side determines that the $1^{st}$ bit in the first data information is the start boundary of the downlink synchronization. This further verifies correctness of obtaining, by the decoder side, the downlink synchronization performed when the interleaving encoding is used in the PON system.

In a possible implementation, after the performing de-interleaving on the data flow based on a start location of the first data information, the method further includes determining that the start location of the first data information is the $1^{st}$ bit in the first data information, and using the $1^{st}$ bit as the start boundary of the downlink synchronization, and descrambling the data flow by using a preset scrambling code. In the foregoing embodiment of this application, if the data flow needs to be scrambled before being sent to the decoder side, the encoder side may determine the preset scrambling code, and then scramble the data flow by using the scrambling code. A scrambling process and a used algorithm are not limited. In this embodiment of this application, because the encoder side scrambles the data flow, after determining a location of the synchronization information in the data flow, the decoder side may also perform descrambling on the data flow. In this embodiment of this application, the decoder side performs correct descrambling based on correct downlink synchronization, to implement descrambling of the received data flow.

According to a second aspect, an embodiment of this application further provides a data processing method in a passive optical network system. The method includes performing FEC encoding on a data block to obtain an encoded data block, performing interleaving encoding on the encoded data block and synchronization information to obtain a to-be-sent data flow, where the synchronization information is distributed in the data flow based on a first permutation interval, and sending the data flow to a decoder side. In the foregoing embodiment of this application, the interleaving encoding may be performed on the FEC-encoded data block and the synchronization information, to obtain a to-be-sent data flow, where the data flow is a bit stream on which the interleaving encoding is used, the data flow includes the synchronization information, and the synchronization information is distributed in the data flow based on the first permutation interval. It implements the even distribution of data blocks in the data flow, and effectively resolves a problem of bit error diffusion in the high-speed PON system.

In a possible implementation, the performing interleaving encoding on the encoded data block and synchronization information includes determining N code blocks used for the interleaving encoding, and separately encoding the data block and the synchronization information into the N code blocks based on a granularity k of the interleaving encoding, where a length of the synchronization information is P bits. In the foregoing embodiment of this application, the encoder side first determines a value of N, where N is a quantity of code blocks on which the interleaving encoding is performed, and one code block may include one or more codewords. In subsequent embodiments, an example in which one code block is one codeword is used for description. The length of the synchronization information is P bits, the interleaving encoding is performed jointly on the synchronization information and the data block, and the encoder side separately encodes the data block and the synchronization information into the N code blocks based on the granularity k of the interleaving encoding. The granularity k of the interleaving encoding refers to a quantity of bits used during interleaving each time. For example, the encoder side first sends data of k bits in a codeword 1 (for example, k may be 1), then sends k bits in a codeword 2, and then sends k bits in each of a codeword 3, a codeword 4, . . . , and a codeword n. The cycle is repeated in sequence until data of k bits in each of the n codewords is completely sent. Then, n+1 to 2n codewords are processed in the same manner until an entire data frame is sent. After the interleaving encoding is performed, the synchronization information used for delimitation is dispersed to a plurality of locations in the data flow. Therefore, the decoder side needs to be capable of determining a location of the synchronization information in the data flow.

In a possible implementation, before the sending the data flow to a decoder side, the method further includes scrambling the data flow by using a preset scrambling code. In the foregoing embodiment of this application, if the data flow needs to be scrambled before being sent to the decoder side, the encoder side may determine the preset scrambling code, and then scramble the data flow by using the scrambling code. A scrambling process and a used algorithm are not limited. In this embodiment of this application, because the encoder side scrambles the data flow, after determining the location of the synchronization information in the data flow, the decoder side may also perform descrambling on the data flow.

According to a third aspect, an embodiment of this application provides a data processing method in a PON system. The method includes obtaining N to-be-encoded code blocks, where the $1^{st}$ code block in the N code blocks includes synchronization information, and N is a quantity of code blocks on which interleaving encoding is performed, performing interleaving encoding on data other than the synchronization information in the N code blocks, and skipping performing interleaving encoding on the synchronization information, and generating a data flow based on the interleaving-encoded data and synchronization information, where the synchronization information is located before the interleaving-encoded data in the data flow. In the foregoing embodiment of this application, an encoder side generates the data flow based on the interleaving-encoded data and synchronization information, where the synchronization information is located before the interleaving-encoded data in the data flow, and the synchronization information is not interleaved in the data flow, so that a decoder side may obtain the synchronization information from a header of the data flow. The decoder side de-interleaves the data that is after the synchronization information in the data flow, to obtain the data flow sent by the encoder side. A problem of bit error diffusion in the PON system is resolved through interleaving the data block. In addition, the synchronization information in the data flow is not interleaved, so that the decoder side can quickly determine the synchronization information in the data flow, and a problem that downlink synchronization cannot be performed in the PON system is resolved.

In some embodiments of this application, the performing interleaving encoding on data other than the synchronization information in the N code blocks, and skipping performing interleaving encoding on the synchronization information includes skipping performing interleaving encoding on the synchronization information whose length is P bits in the $1^{st}$ code block, and performing interleaving encoding on data that is of the first P bits in the $2^{nd}$ code block to an $N^{th}$ code block in the N code blocks, and performing interleaving encoding on data other than the synchronization information in the $1^{st}$ code block and data other than data of P bits in the $2^{nd}$ code block to the $N^{th}$ code block. In the foregoing embodiments of this application, according to a fourth aspect, an embodiment of this application provides a data processing method in a PON system. The method includes receiving a data flow sent by an encoder side, obtaining synchronization information is from the data flow, where the synchronization information is located before interleaving-encoded data in the data flow, and interleaving encoding is not performed on the synchronization information, and performing de-interleaving on the data that is after the synchronization information in the data flow. In the foregoing embodiment of this application, the encoder side generates the data flow based on the interleaving-encoded data and synchronization information, where the synchronization information is located before the interleaving-encoded data in the data flow, and the synchronization information is not interleaved in the data flow, so that a decoder side may obtain the synchronization information from a header of the data flow. The decoder side de-interleaves the data that is after the synchronization information in the data flow, to obtain the data flow sent by the encoder side. A problem of bit error diffusion in the PON system is resolved through interleaving the data block. In addition, the synchronization information in the data flow is not interleaved, so that the decoder side can quickly determine the synchronization information in the data flow, and a problem that downlink synchronization cannot be performed in the PON system is resolved.

In some embodiments of this application, the de-interleaving data that is after the synchronization information in the data flow includes obtaining (N−1)×P-bit data that is after the synchronization information in the data flow, where N is a quantity of code blocks on which the interleaving decoding is performed, and P is a length of the synchronization information, de-interleaving the (N−1)×P-bit data into the $2^{nd}$ code block to an $N^{th}$ code block, and de-interleaving data that is after the (N−1)×P-bit data in the data flow into the $1^{st}$ code block to the $N^{th}$ code block. In the foregoing embodiments of this application, according to a fifth aspect, an embodiment of this application provides a data processing device. The data processing device includes a receiving module, configured to receive a data flow sent by an encoder side, where the data flow is a bit stream on which interleaving encoding is used, the data flow includes synchronization information, and the synchronization information is distributed in the data flow based on a first permutation interval, and a processing module is configured to obtain, from the data flow, first data information based on a first value interval and a first value length, where the first value interval is equal to the first permutation interval, and a difference between the first value length and a length of the synchronization information is less than or equal to a preset error value. The processing module, configured to when a similarity between the first data information and the synchronization information exceeds a preset similarity threshold, perform de-interleaving on the data flow based on a start location of the first data information.

In a possible implementation, the processing module is configured to obtain, from the data flow, a first data substream whose length is P×N bits, where P is the length of the synchronization information, N is a quantity of code blocks on which the interleaving encoding is performed, and the code block includes at least one codeword, and obtain, from the first data substream based on the first value interval and the first value length, first data information including P-bit data, where the value interval is (N−1)×k bits, k is a granularity of the interleaving encoding, and × represents a multiplication operation.

In a possible implementation, the processing module is configured to divide the first data substream into P/k data sets, where each data set includes N×k-bit data, and / represents a division operation, and obtain k-bit data from each of the P/k data sets, where the first data information includes a total of P-bit data obtained from the P/k data sets.

In a possible implementation, when the similarity between the first data information and the synchronization information does not exceed the similarity threshold, the processing module is configured to obtain, from the data flow, a second data substream whose length is P×N bits, where data of at least one different bit exists in the second data substream and the first data substream, obtain, from the second data substream based on the first value interval and the first value length, second data information including P-bit data, and when a similarity between the second data information and the synchronization information exceeds the similarity threshold, perform de-interleaving on the data flow based on a start location of the second data information.

In a possible implementation, the processing module is configured to after the performing de-interleaving on the data flow based on a start location of the first data information, determine that the start location of the first data information is the $1^{st}$ bit in the first data information, and use the $1^{st}$ bit as a start boundary of the downlink synchronization, and performing forward error correction (FEC) decoding on the data flow.

In a possible implementation, the processing module is configured to after the using the $1^{st}$ bit as a start boundary of the downlink synchronization, and performing FEC decoding on the data flow, if the FEC decoding performed on the data flow succeeds, determine that the $1^{st}$ bit in the first data information is the start boundary of the downlink synchronization.

In a possible implementation, the processing module is configured to after the performing de-interleaving on the data flow based on a start location of the first data information, determine that the start location of the first data information is the $1^{st}$ bit in the first data information, and use the $1^{st}$ bit as the start boundary of the downlink synchronization, and descramble the data flow by using a preset scrambling code.

In the fifth aspect of this application, the composition modules of the data processing device may further perform the steps described in the first aspect and the possible implementations. For details, refer to the descriptions in the first aspect and the possible implementations.

According to a sixth aspect, an embodiment of this application provides a data processing device, including a processing module, configured to perform FEC encoding on a data block to obtain an encoded data block where the processing module is configured to perform interleaving encoding on the encoded data block and synchronization information to obtain a to-be-sent data flow, where the synchronization information is distributed in the data flow based on a first permutation interval, and a sending module, configured to send the data flow to a decoder side.

In a possible implementation, the processing module is configured to determine N code blocks used for interleaving encoding, and separately encode the data block and the synchronization information into the N code blocks based on a granularity k of the interleaving encoding, where a length of the synchronization information is P bits.

In a possible implementation, the processing module is configured to before the sending module sends the data flow to the decoder side, scramble the data flow by using a preset scrambling code.

In the sixth aspect of this application, the composition modules of the data processing device may further perform the steps described in the second aspect and the possible implementations. For details, refer to the descriptions in the second aspect and the possible implementations.

According to a seventh aspect, an embodiment of this application provides a data processing device, including a processing module, configured to obtain N to-be-encoded code blocks, where the $1^{st}$ code block in the N code blocks includes synchronization information, and N is a quantity of code blocks on which interleaving encoding is performed. The processing module is configured to perform interleaving encoding on data other than the synchronization information in the N code blocks, and skip performing interleaving encoding on the synchronization information. The processing module is configured to generate a data flow according to the interleaving-encoded data and synchronization information, where the synchronization information is located before the interleaving-encoded data in the data flow.

In some embodiments of this application, the processing module is configured to skip performing interleaving encoding on synchronization information whose length is P bits in the $1^{st}$ code block, and perform interleaving encoding on data that is of the first P bits in the $2^{nd}$ code block to an $N^{th}$ code block in the N code blocks, and perform interleaving encoding on data other than the synchronization information in the $1^{st}$ code block and data other than data of P bits in the $2^{nd}$ code block to the $N^{th}$ code block.

In the seventh aspect of this application, the composition modules of the data processing device may further perform the steps described in the third aspect and the possible implementations. For details, refer to the descriptions in the third aspect and the possible implementations.

According to an eighth aspect, an embodiment of this application provides a data processing device, including a receiving module, configured to receive a data flow sent by an encoder side, and a processing module, configured to obtain synchronization information from the data flow, where the synchronization information is located before the interleaving-encoded data in the data flow, and the interleaving encoding is not performed on the synchronization information. The processing module is configured to perform de-interleaving on data that is after the synchronization information in the data flow.

In some embodiments of this application, the processing module is configured to obtain (N−1)×P-bit data that is after the synchronization information in the data flow, where N is a quantity of code blocks on which the interleaving decoding is performed, and P is a length of the synchronization information, and de-interleave the (N−1)×P-bit data into the $2^{nd}$ code block to an $N^{th}$ code block, and de-interleave data that is after the (N−1)×P-bit data in the data flow into the $1^{st}$ code block to the $N^{th}$ code block.

In an eighth aspect of this application, the composition modules of the data processing device may further perform the steps described in the fourth aspect and the possible implementations. For details, refer to the descriptions in the fourth aspect and the possible implementations.

According to a ninth aspect, an embodiment of this application provides a computer-readable storage medium. The computer-readable storage medium stores instructions, where when the instructions are run on a computer, the computer is enabled to perform the method according to any one of the first aspect to the fourth aspect.

According to a tenth aspect, an embodiment of this application provides a computer program product including instructions, where when the computer program product runs on a computer, the computer is enabled to perform the method according to any one of the first aspect to the fourth aspect.

According to an eleventh aspect, an embodiment of this application provides a communication apparatus, where the communication apparatus may include an entity such as a terminal device or a chip, and the communication apparatus includes a processor and a memory, where the memory is configured to store instructions, and the processor is configured to execute the instructions in the memory, so that the communication apparatus performs the method according to any one of the first aspect to the fourth aspect.

According to a twelfth aspect, this application provides a chip system. The chip system includes a processor, configured to support a data processing device in implementing functions in the foregoing aspects, for example, sending or processing data and/or information in the foregoing methods. In a possible design, the chip system further includes a memory, and the memory is configured to store program instructions and data that are necessary for a data processing device. The chip system may include a chip, or may include a chip and another discrete component.

DETAILED DESCRIPTION OF ILLUSTRATIVE EMBODIMENTS

Embodiments of this application provide a data processing method and device in a passive optical network system, to resolve a problem of bit error diffusion in a high-speed PON system and implement downlink synchronization in the high-speed PON system.

The following describes embodiments of this application with reference to the accompanying drawings.

In the specification, claims, and accompanying drawings of this application, the terms "first", "second", and so on are intended to distinguish between similar objects but do not necessarily indicate a specific order or sequence. It should be understood that the terms used in such a way are interchangeable in a proper circumstance, and this is merely a distinguishing manner that is used when objects having a same attribute are described in embodiments of this application. In addition, the terms "include", "contain" and any other variants thereof mean to cover non-exclusive inclusion, so that a process, method, system, product, or device that includes a series of units is not necessarily limited to those units, but may include other units not expressly listed or inherent to such a process, method, system, product, or device.

Figure 1:
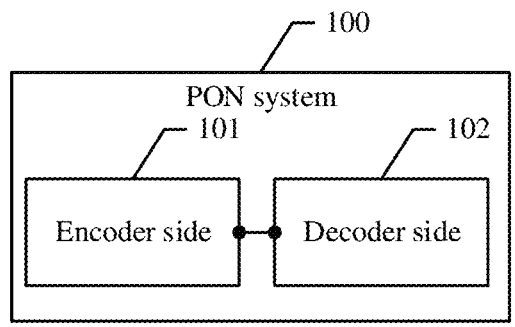
FIG. 1 is a schematic diagram of a composition architecture of a passive optical network system according to an embodiment of this application.

FIG. 1 is a system architectural diagram of a PON system. The PON system may include an encoder side 101 and a decoder side 102.

The encoder side 101 and the decoder side 102 may communicate with each other. For example, the encoder side 101 sends a data flow to the decoder side 102. The encoder side 101 may be implemented by using a data processing device. The encoder side 101 may use an interleaving encoding manner to resolve a bit error problem in the current PON system. The decoder side 102 may be implemented by using another data processing device. The decoder side 102 obtains a first data information based on a preset value interval and value length, and then obtains synchronization information based on the first data information. For example, the encoder side 101 may be specifically an OLT device, and the decoder side 102 may be specifically an ONU device.

For example, the ONU device may provide a user-side interface for the PON system, and the ONU device is connected to an ODN device. If the ONU device directly provides a user port function, for example, an Ethernet user port used by a personal computer to access the internet, the ONU device may be referred to as an optical network terminal (optical network terminal, ONT). In subsequent embodiments, the ONU device may be collectively referred to as the ONU device and the ONT device.

The PON system provided in embodiments of this application may be a high-speed PON system, for example, may be a 50 G PON system. In the PON system provided in embodiments of this application, in addition to using enhanced forward error correction (forward error correction, FEC) such as a low density parity check code (low density parity check code, LDPC), a digital equalization technology may be introduced to compensate for performance penalty caused by insufficient bandwidth of an optical component and transmission dispersion. For some digital equalizers, for example, a decision feedback equalizer (decision feedback equalization, DFE) or a maximum likelihood sequence estimator (maximum likelihood sequence estimation, MLSE), bit error diffusion or a burst bit error may be introduced while link performance is compensated, in other words, if a bit error occurs at a receiving end (that is, a decoder side), the bit error may cause a bit error or an associated bit error to occur in a plurality of subsequent bits of the bit error. The following uses the bit error diffusion as an example for description. Bit errors may not be distributed randomly enough in a data flow due to the burst bit error, and there are many bit errors in some FEC codewords. As a result, the FEC cannot correct error bits. The interleaving encoding manner may be introduced in the PON system provided in embodiments of this application. For example, bit interleaving encoding is used, and bit error diffusion (or a burst bit error, an associated bit error, and the like) caused by the equalizer is dispersed into different FEC codewords at the receiving end. When the encoder side uses bit interleaving, and the decoder side performs de-interleaving at the same time, a boundary of the interleaving synchronization information and a size of a data block need to be identified in advance. The decoder side can resolve a problem of data processing and synchronization of the transmitting end and the receiving end after interleaving is introduced in the PON system.

Figure 2:
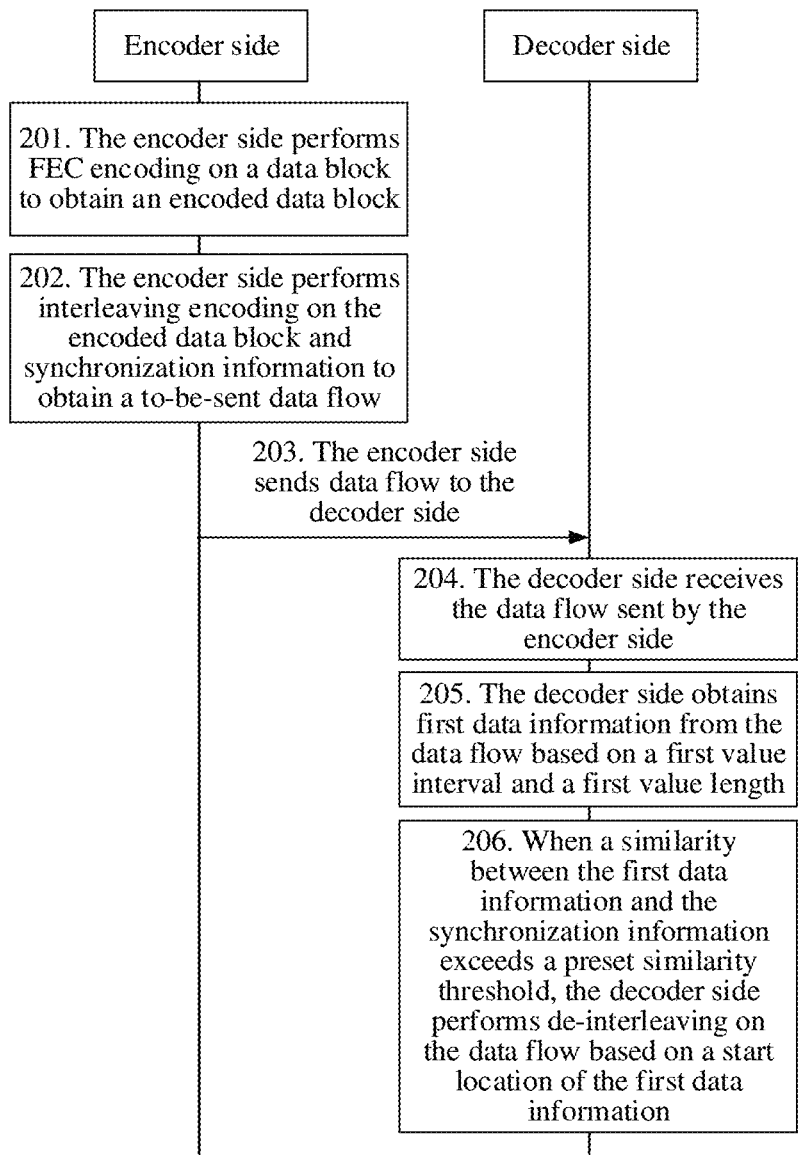
FIG. 2 is a schematic flowchart of interaction between an encoder side and a decoder side in a data processing method in a passive optical network system according to an embodiment of this application.

As shown in FIG. 2, an embodiment of this application provides a data processing method in a passive optical network system. The method includes the following steps.

201. An encoder side performs FEC encoding on a data block to obtain an encoded data block.

The encoder side may perform FEC encoding on one or more data blocks to obtain one or more encoded data blocks. A specific process of the FEC encoding is not described in detail. The data block may include one or more FEC codewords.

202. The encoder side performs interleaving encoding on the encoded data block and synchronization information to obtain a to-be-sent data flow, where the synchronization information is distributed in the data flow based on a first permutation interval.

The encoder side may further obtain the synchronization information, and the synchronization information may also be referred to as a synchronization sequence (Psync for short). To resolve a bit error diffusion problem generated in the PON system, the interleaving encoding is introduced before performing downlink transmission in this embodiment of this application. To be specific, the interleaving encoding may be performed on the FEC-encoded data block and the synchronization information to obtain the to-be-sent data flow. The synchronization information is distributed in the data flow based on the first permutation interval. For example, the first permutation interval is related to a depth of the interleaving encoding. The first permutation interval may be a preset permutation interval, or may be a permutation interval determined by the encoder side and a decoder side through negotiation, or the first permutation interval is a permutation interval determined by the encoder side, and then the encoder side notifies the permutation interval to the decoder side.

Before the interleaving encoding is performed, the synchronization information may be located before the FEC-encoded data block, in other words, the synchronization information may be header data of the FEC-encoded data block. For example, the interleaving encoding is performed in a unit of the FEC codeword. Before the interleaving encoding is performed, the synchronization information is located in the $1^{st}$ codeword, and the FEC-encoded data block and the synchronization information are interleaved between a plurality of codewords. Through the interleaving encoding, generated bit errors are randomly distributed in the data flow, the bit errors in a plurality of FEC codewords are even, and a problem that the FEC cannot correct error bits does not exist.

In some embodiments of this application, step 202 in which the encoder side performs interleaving encoding on the encoded data block and the synchronization information includes the encoder side determines N code blocks used for the interleaving encoding.

The encoder side separately encodes the data block and the synchronization information into the N code blocks based on a granularity k of the interleaving encoding, where a length of the synchronization information is P bits.

The encoder side first determines a value of N, where N is a quantity of code blocks on which the interleaving encoding is performed, and one code block may include one or more codewords. In subsequent embodiments, an example in which one code block is one codeword is used for description. The length of the synchronization information is P bits, the interleaving encoding is performed jointly on the synchronization information and the data block, and the encoder side separately encodes the data block and the synchronization information into the N code blocks based on the granularity k of the interleaving encoding. The granularity k of the interleaving encoding refers to a quantity of bits used during interleaving each time. For example, the encoder side first sends data of k bits in a codeword 1 (for example, k may be 1), then sends k bits in a codeword 2, and then sends k bits in each of a codeword 3, a codeword 4, . . . , and a codeword n. The cycle is repeated in sequence until data of k bits in each of the n codewords is completely sent. Then, n+1 to 2n codewords are processed in the same manner until an entire data frame is sent. After the interleaving encoding is performed, the synchronization information used for delimitation is dispersed to a plurality of locations in the data flow. Therefore, the decoder side needs to be capable of determining a location of the synchronization information in the data flow.

203. The encoder side sends the data flow to the decoder side.

After the encoder side performs interleaving encoding and obtains the to-be-sent data, the encoder side and a receiving end may communicate with each other, and the encoder side sends the data flow to the decoder side.

In some embodiments of this application, before step 203 in which the encoder side sends the data flow to the decoder side, the data processing method provided in embodiments of this application further includes scrambling the data flow by using a preset scrambling code.

If the data flow needs to be scrambled before being sent to the decoder side, the encoder side may determine the preset scrambling code, and then scramble the data flow by using the scrambling code. A scrambling process and a used algorithm are not limited. In this embodiment of this application, because the encoder side scrambles the data flow, after determining the location of the synchronization information in the data flow, the decoder side may also perform descrambling on the data flow.

In this embodiment of this application, if the encoder side performs interleaving encoding on both the synchronization information and the data block, a case in which the synchronization information is distributed in the data flow based on the permutation interval is generated. In this case, the decoder side needs to be capable of outputting the synchronization information in the received data flow. Specifically, the decoder side may perform subsequent step 204 to step 206.

204. The decoder side receives the data flow sent by the encoder side, where the data flow is a bit stream on which the interleaving encoding is used, the data flow includes the synchronization information, and the synchronization information is distributed in the data flow based on the first permutation interval.

The encoder side and the receiving end may communicate with each other. The encoder side sends the data flow to the decoder side, and the decoder side may receive the data flow from the encoder side. The data flow carries the synchronization information and the data block, and the interleaving encoding is performed on the synchronization information and the data block. The synchronization information is distributed in the data flow based on the first permutation interval, and the encoder side performs interleaving encoding on the synchronization information and the data block in the data flow. Therefore, the data flow is the bit stream on which the interleaving encoding is used. For example, the first permutation interval is related to a depth of the interleaving encoding. The first permutation interval may be the preset permutation interval, or may be the permutation interval determined by the encoder side and the decoder side through negotiation, or the first permutation interval is the permutation interval determined by the encoder side, and then the encoder side notifies the permutation interval to the decoder side.

205. The decoder side obtains first data information from the data flow based on a first value interval and a first value length, where a value of the value interval is equal to a value of the first permutation interval, and a difference between the value length and the length of the synchronization information is less than or equal to a preset error value.

The decoder side obtains the first value interval and the first value length, where the first value interval (a value interval for short below) is a value of an interval used when the decoder side samples data from the data flow, and a value of the value interval may be equal to the permutation interval of the synchronization information in the data flow. For example, the first value interval is related to the depth of the interleaving encoding. The first value interval may be a preset value interval, or may be a value interval determined by the encoder side and the decoder side through negotiation, or the first value interval is a value interval determined by the encoder side, and then the encoder side notifies the value interval to the decoder side. The first value length (a value length for short below) is a total data length that needs to be collected by the decoder side from the data flow. In addition, the first value length may be a preset value length, or may be a value length determined by the encoder side and the decoder side through negotiation, or the first value length is a value length determined by the encoder side, and then the encoder side notifies the value length to the decoder side. The difference between the value length and the length of the synchronization information is less than or equal to the preset error value, and the error value may be determined based on a specific application scenario. For example, the error value may be t bits. For example, t may be 0 or 1. A value of the error value is not limited. For example, if the length of the synchronization information may be P bits, the value length may be P bits, or the value length may be P−1 or P+1 bits.

In this embodiment of this application, the decoder side obtains the preset value interval and first value length. After the decoder side receives the data flow, the decoder side obtains the first data information from the data flow based on the first value interval and the first value length. The decoder side may sample the data flow based on two locally pre-stored parameters (the value interval and the value length), to obtain the first data information, where a length of the first data information is the value length, and component data in the first data information is obtained by sampling the data flow based on the value interval. In addition, the value interval is equal to the permutation interval, and the difference between the value length and the length of the synchronization information is less than or equal to the preset error value.

It should be noted that, in this embodiment of this application, the first data information includes data collected by the decoder side from the received data flow, the first data information may be obtained by sampling the synchronization information carried in the data flow, and the first data information may be used to determine whether the first data information is used for downlink synchronization. For example, the decoder side may determine whether a similarity between the first data information and the synchronization information exceeds a preset similarity threshold, where the similarity refers to the similarity between the first data information and the synchronization information. For example, a quantity of bits of same data in the first data information and the synchronization information may be the similarity, and the similarity threshold is a threshold of the similarity between the first data information and the synchronization information. If the similarity between the first data information and the synchronization information exceeds the preset similarity threshold, it indicates that the first data information is similar to the synchronization information, and the first data information may be used as the synchronization information determined by the decoder side from the data flow. If the similarity between the first data information and the synchronization information does not exceed the preset similarity threshold, it indicates that the first data information is not similar to the synchronization information, and the first data information cannot be used as the synchronization information determined by the decoder side from the data flow. For example, the similarity threshold may be an absolutely similar quantity of bits, or may be a similar proportion value. For example, if the synchronization information has P-bit data, the similarity threshold may be P−m, and m may be 2, 3, 4, or the like. For another example, the similarity threshold may be (P−m)/P, and m may be 2, 3, 4, or the like. For example, the similarity threshold may be 95% or 96%, and specifically depends on values of m and P.

This is not limited. In this embodiment of this application, the decoder side may further determine whether a difference degree between the first data information and the synchronization information is less than or equal to a preset difference degree threshold. Through the determining, it may also be determined whether the similarity between the first data information and the synchronization information exceeds the preset similarity threshold, where the difference degree refers to a dissimilarity between the first data information and the synchronization information. The similarity and the difference degree are two opposite parameters that measure the similarity between the first data information and the synchronization information. Details are not described herein again.

In some embodiments of this application, step 205 in which the decoder side obtains the first data information from the data flow based on the first value interval and the first value length includes the following steps.

A1. The decoder side obtains, from the data flow, a first data substream whose length is P×N bits, where P is the length of the synchronization information, N is the quantity of code blocks on which the interleaving encoding is performed, and the code block includes at least one codeword.

The decoder side determines the value window based on the value interval and the value length, and the value window is P×N bits. In this case, the decoder side may obtain, from the data flow based on the value window, the first data substream whose length is P×N bits. The first data substream is a segment of data sequence captured from a data flow received by a decoder side. A specific capturing manner depends on the value window determined by the decoder side, where P is the length of synchronization information, N is the quantity of code blocks on which the interleaving encoding is performed, and the code block includes at least one codeword.

A2. The decoder side obtains, from the first data substream based on the first value interval and the first value length, the first data information including P-bit data, where the value interval is (N−1)×k bits, k is a granularity of the interleaving encoding, and × represents a multiplication operation.

The decoder side obtains k-bit data from the first data substream at a time based on the interval corresponding to the first value interval, or may obtain k-bit data from the first data substream for a plurality of times based on the first value interval. Therefore, the p-bit data can be obtained by concatenating all the obtained k-bit data. For example, the value interval is the (N−1)×k bits, and k-bit data is taken out at an interval of "(N−1)×k bits". Then, all the obtained k-data may be combined together to obtain first data information with P bits. The first data information may be used to determine whether the first data information is similar to the synchronization information. In this embodiment of this application, the decoder side may obtain the first data information whose length is the same as the synchronization information in the foregoing manner.

For example, N is the quantity of code blocks on which the interleaving encoding is performed, and N multiplied by a code block size is the depth of the interleaving encoding. For example, a size of each code block is one FEC codeword, and if k is equal to 1, the decoder side obtains one-bit data from the first data substream based on an interval of N−1 bits. As a length of the first data substream is N×P, the first data information including P-bit data may be obtained.

Further, in some embodiments of this application, step A2 in which the decoder side obtains, from the first data substream based on the first value interval and the first value length, the first data information including the P-bit data includes the following steps.

A21. The decoder side divides the first data substream into P/k data sets, where each data set includes N×k-bit data, and / represents a division operation.

The length of the first data substream is N×P, and the decoder side extracts the first data substream based on the granularity k of the interleaving encoding, to obtain P/k data sets, where each data set includes N×k-bit data, and / indicates a division operation. If k is equal to 1, P data sets may be obtained. If k is equal to 2, P/2 data sets may be obtained, and so on.

A22. The decoder side separately obtains k-bit data from each of the P/k data sets, where the first data information includes P-bit data obtained from the P/k data sets.

After the decoder side determines the P/k data sets, k-bit data is obtained from each data set. In this case, for the P/k data sets, a total of P-bit data may be obtained, and the P-bit data constitutes the foregoing first data information. The length of the first data information is P bits. In this embodiment of this application, the decoder side may obtain the first data information whose length is the same as the synchronization information in the foregoing manner.

206. When the similarity between the first data information and the synchronization information exceeds the preset similarity threshold, the decoder side performs de-interleaving on the data flow based on a start location of the first data information.

In this embodiment of this application, after the decoder side obtains the first data information in the manner in step 205, the decoder side may determine whether the similarity between the first data information and the synchronization information exceeds the preset similarity threshold. When the similarity between the first data information and the synchronization information exceeds the preset similarity threshold, it indicates that the first data information is very similar to the synchronization information, and the first data information may be used as the synchronization information determined by the decoder side from the data flow. The decoder side performs de-interleaving on the data flow based on the start location of the first data information, to obtain the de-interleaved original data flow, in other words, the decoder side may use the start location of the first data information as a boundary of the downlink synchronization to determine the synchronization information in the data flow. This resolves a problem that the downlink synchronization cannot be determined when the interleaving encoding is used in the PON system.

In some embodiments of this application, when the similarity between the first data information and the synchronization information does not exceed the similarity threshold, the data processing method performed by the decoder side further includes the following steps.

B1. The decoder side obtains, from the data flow, a second data substream whose length is P×N bits, where data of at least one different bit exists in the second data substream and the first data substream.

B2. The decoder side obtains, from the second data substream based on the first value interval and the first value length, second data information including P-bit data.

B3. When a similarity between the second data information and the synchronization information exceeds a similarity threshold, the decoder side performs de-interleaving on the data flow based on a start location of the second data information.

The decoder side uses a polling processing manner. When the similarity between the first data information and the synchronization information exceeds the similarity threshold, the synchronization information is obtained from the data flow through the foregoing step 206. When the similarity between the first data information and the synchronization information does not exceed the similarity threshold, the synchronization information is obtained from the data flow through step B1 to step B3. Similarly, if it is determined, through step B1 to step B2, that the similarity between the second data information and the synchronization information does not exceed the similarity threshold, the decoder side may further obtain a third data substream from the data flow until data information similar to the synchronization information is obtained. An implementation of step B1 to step B3 is similar to the processing of the first data information in the foregoing embodiment, and details are not described this time again.

In some embodiments of this application, after the decoder side performs de-interleaving on the data flow based on the start location of the first data information in step 206, the data processing method performed by the decoder side further includes the following steps.

C1. The decoder side determines that the start location of the first data information is the $1^{st}$ bit in the first data information.

C2. The decoder side uses the $1^{st}$ bit as a start boundary of the downlink synchronization, and performs forward error correction (FEC) decoding on the data flow.

After the decoder side de-interleaves the data flow based on the start location of the first data information, the decoder side determines that the start location of the first data information is the $1^{st}$ bit in the first data information, in other words, the decoder side finds the $1^{st}$ bit in the first data information. The $1^{st}$ bit is delimitation for the decoder side to perform downlink synchronization. The decoder side uses the $1^{st}$ bit as the start boundary of the downlink synchronization, and performs FEC decoding on the data flow, so that the decoder side performs FEC decoding on the received data flow. Therefore, the decoder side may obtain the original data block that exists before the encoder side performs FEC encoding, and the decoder side obtains content of the data block transmitted by the encoder side.

In some embodiments of this application, after the decoder side performs FEC decoding on the data flow by using the $1^{st}$ bit as the start boundary of the downlink synchronization in step C2, the data processing method performed by the decoder side further includes the following step.

If the FEC decoding performed on the data flow succeeds, the decoder side determines that the $1^{st}$ bit in the first data information is the start boundary of the downlink synchronization.

The FEC decoding performed by the decoder side may be implemented by using an FEC decoder. The FEC decoder may output a flag indicating whether the decoding succeeds. If the FEC decoding performed on the data flow succeeds, it indicates that the $1^{st}$ bit of the first data information that is determined by the decoder side and used as the start location of the synchronization information is correct. In this case, the decoder side determines that the $1^{st}$ bit in the first data information is the start boundary of the downlink synchronization. This further verifies correctness of obtaining, by the decoder side, the downlink synchronization performed when the interleaving encoding is used in the PON system.

In some embodiments of this application, after the decoder side performs de-interleaving on the data flow based on the start location of the first data information in step 206, the data processing method performed by the decoder side further includes the following steps.

The decoder side determines that the start location of the first data information is the $1^{st}$ bit in the first data information.

The decoder side uses the $1^{st}$ bit as the start boundary of the downlink synchronization, and descrambles the data flow by using the preset scrambling code.

If the data flow needs to be scrambled before being sent to the decoder side, the encoder side may determine the preset scrambling code, and then scramble the data flow by using the scrambling code. A scrambling process and a used algorithm are not limited. In this embodiment of this application, because the encoder side scrambles the data flow, after determining the location of the synchronization information in the data flow, the decoder side may also perform descrambling on the data flow. In this embodiment of this application, the decoder side performs correct descrambling based on correct downlink synchronization, to implement descrambling of the received data flow.

It can be learned from examples described in the foregoing embodiment that the data flow sent by the encoder side is first received, where the data flow is the bit stream on which the interleaving encoding is used. The data flow includes the synchronization information which is distributed in the data flow based on the first permutation interval. Then, the first data information is obtained from the data flow based on the first value interval and the first value length, where the value interval is equal to the permutation interval, and the difference between the value length and the length of the synchronization information is less than or equal to the preset error value. When the similarity between the first data information and the synchronization information exceeds the preset similarity threshold, the de-interleaving is performed on the data flow based on the start location of the first data information. In this embodiment of this application, the synchronization information and the data block in the data flow sent by the encoder side are interleaved together, and the synchronization information is distributed at intervals in the data flow. Therefore, the data flow may be sampled based on the first value interval and the value length, to obtain the first data information. The first data information is obtained by obtaining a value from the data flow based on the value length, and the first data information is obtained by obtaining a value from the data flow based on the value interval. When the similarity between the first data information and the synchronization information exceeds the similarity threshold, the start location of the first data information may be used to perform de-interleaving on the data flow, so that the synchronization information in the data flow can finally be obtained. This embodiment of this application is applicable to a scenario of the interleaving encoding of the data flow in the high-speed PON system, and resolves a problem that the downlink synchronization cannot be determined when the interleaving encoding is used for the data flow.

Figure 3:
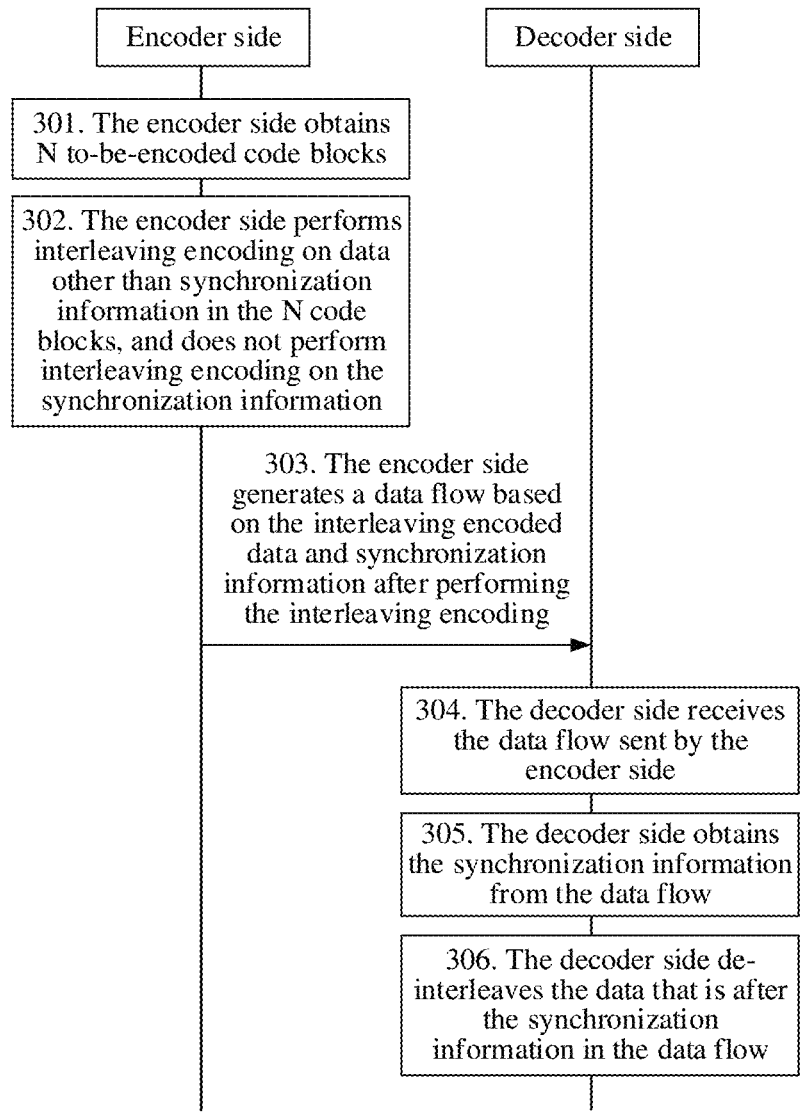
FIG. 3 is a schematic flowchart of interaction between an encoder side and a decoder side in a data processing method in a passive optical network system according to an embodiment of this application.

As shown in FIG. 3, an embodiment of this application further provides a data processing method in a PON system. The method includes the following steps.

301. An encoder side obtains N to-be-encoded code blocks, where the $1^{st}$ code block in the N code blocks includes synchronization information, and N is a quantity of code blocks on which interleaving encoding is performed.

The encoder side may perform FEC encoding on a plurality of data blocks, and then add the synchronization information to before the FEC-encoded data block. For example, the synchronization information and the data block may be divided into N code blocks, and the $1^{st}$ code block in the N code blocks includes the synchronization information.

302. The encoder side performs interleaving encoding on data other than the synchronization information in the N code blocks, and does not perform interleaving encoding on the synchronization information.

The encoder side performs interleaving encoding on the data in the N code blocks, but does not perform interleaving encoding on the synchronization information. This helps the decoder side quickly determine the synchronization information, to be specific, the encoder side may skip the interleaving encoding on the synchronization information in the $1^{st}$ code block in the N code blocks, to reduce complexity of determining the synchronization information by the decoder side.

303. The encoder side generates the data flow based on the interleaving-encoded data and synchronization information, where the synchronization information is located before the interleaving-encoded data in the data flow.

In this embodiment of this application, after the encoder side performs interleaving encoding, the encoder side places the synchronization information before the interleaving-encoded data, to generate the data flow, and then the encoder side sends the data flow to the decoder side. Because the synchronization information is located before the interleaving-encoded data in the data flow, the decoder side can quickly determine the synchronization information.

In some embodiments of this application, the performing interleaving encoding on data other than the synchronization information in the N code blocks, and skipping performing interleaving encoding on the synchronization information includes skipping performing interleaving encoding on the synchronization information whose length is P bits in the $1^{st}$ code block, and performing on data that is of the first P bits in the $2^{nd}$ code block to an $N^{th}$ code block in the N code blocks, and performing interleaving encoding on data other than the synchronization information in the $1^{st}$ code block and data other than data of P bits in the $2^{nd}$ code block to the $N^{th}$ code block.

For the N code blocks, each code block has the data of the first P bits and data after the P bits, and the first P bits in the $1^{st}$ code block are the synchronization information. The first P bits in the $2^{nd}$ code block to the $N^{th}$ code block in the N code blocks are data content, and an interleaving manner of the first N code blocks in each data frame is different from an interleaving manner of subsequent N code blocks. To be specific, the first P bits of the $1^{st}$ code block do not participate in the interleaving, and the first P bits of the remaining N−1 code blocks are interleaved. Other data of the first N code blocks is still interleaved between the N code blocks. In the foregoing interleaving manner, the interleaving encoding is not performed on the synchronization information in the N code blocks. This helps the decoder side quickly determine the synchronization information, to be specific, the encoder side may skip the interleaving encoding on the synchronization information in the $1^{st}$ code block in the N code blocks, to reduce complexity of determining the synchronization information by the decoder side.

304. The decoder side receives the data flow sent by the encoder side.

The encoder side and a receiving end may communicate with each other. The encoder side sends the data flow to the decoder side, and the decoder side may receive the data flow from the encoder side. The data flow carries the synchronization information and the data block, and the interleaving encoding is not performed on the synchronization information and the interleaving encoding is performed on the data block. The synchronization information is distributed at a header of the data flow.

305. The decoder side obtains the synchronization information from the data flow, where the synchronization information is located before the interleaving-encoded data in the data flow, and the interleaving encoding is not performed on the synchronization information.

The synchronization information is distributed at the header of the data flow. For example, the synchronization information uses a special value, so that the decoder side quickly detects the synchronization information from the header of the data flow.

306. The decoder side de-interleaves data that is after the synchronization information in the data flow.

The decoder side performs de-interleaving based on the start location of the synchronization information, in other words, the decoder side may determine the synchronization information in the data flow. This resolves a problem that downlink synchronization cannot be determined in the PON system when the interleaving encoding is used.

In some embodiments of this application, the de-interleaving data that is after the synchronization information in the data flow includes obtaining (N−1)×P-bit data that is after the synchronization information in the data flow, where N is a quantity of code blocks on which the interleaving decoding is performed, and P is a length of the synchronization information, de-interleaving the (N−1)×P-bit data into the $2^{nd}$ code block to the $N^{th}$ code block, and de-interleaving data that is after the (N−1)×P-bit data in the data flow into the $1^{st}$ code block to the $N^{th}$ code block.

The decoder side uses a processing manner opposite to that of the foregoing encoder side. The decoder side first finds the synchronization information, and then performs de-interleaving on the (N−1)×P-bit data that is after the synchronization information in the data flow, to obtain the $2^{nd}$ code block to the $N^{th}$ code block. Then, the data that is after the (N−1)×P-bit data in the data flow is de-interleaved into the $1^{st}$ code block to the $N^{th}$ code block, and the de-interleaving may be completed in the foregoing manner. No limitation is imposed. After the de-interleaving, the decoder side may further perform FEC decoding or descrambling, and this is not limited herein.

It can be learned from examples described in the foregoing embodiment that, in this embodiment of this application, the encoder side generates the data flow based on the interleaving-encoded data and synchronization information, where the synchronization information is located before the interleaving-encoded data in the data flow, and the synchronization information is not interleaved in the data flow, so that the decoder side may obtain the synchronization information from a header of the data flow. The decoder side de-interleaves the data that is after the synchronization information in the data flow, to obtain the data flow sent by the encoder side. A problem of bit error diffusion in the PON system is resolved through interleaving the data block. In addition, the synchronization information in the data flow is not interleaved, so that the decoder side can quickly determine the synchronization information in the data flow, and a problem that the downlink synchronization cannot be performed in the PON system is resolved.

To help better understand and implement the foregoing solution in this embodiment of this application, the following provides specific descriptions by using corresponding application scenarios as examples.

Figure 4:
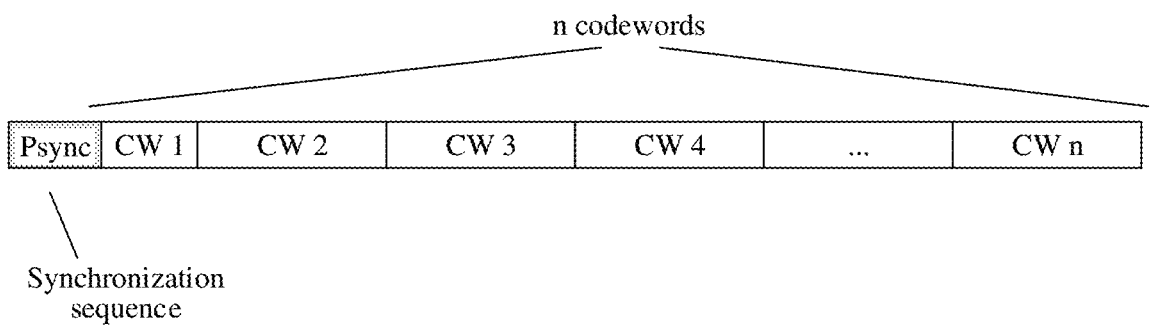
FIG. 4 is a schematic diagram of data permutation before interleaving encoding according to an embodiment of this application.

The following describes a downlink data processing procedure in the 50 G PON system by using an example in which the PON system is a 50 G PON system. To resolve the problem of bit error diffusion, the interleaving encoding is introduced in downlink in this embodiment of this application, and the interleaving is performed in a unit of the FEC codeword. The data interleaving is performed between a plurality of FEC codewords. A format of a data frame after the FEC encoding is shown in FIG. 4. Each data frame includes n FEC codewords (codewords, CWs). For example, n is 4. The $1^{st}$ codeword includes a synchronization sequence (Psync) used for frame delimitation. When the interleaving encoding is not performed, the decoder side searches for the Psync sequence in the received data flow, and the frame delimitation and FEC codeword delimitation can be completed by using the Psync. After the interleaving encoding is introduced, the interleaving may break up the Psync that is originally used for delimitation, and the synchronization sequence is distributed at different locations in the data flow, in other words, there is no continuous Psync code pattern in the data flow.

Figure 5:
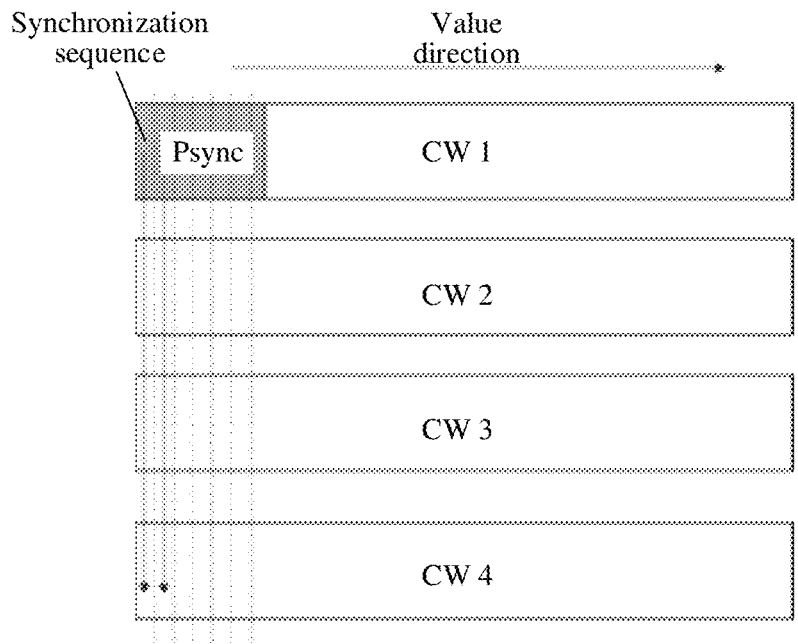
FIG. 5 is a schematic diagram of interleaving of synchronization information between four codewords according to an embodiment of this application.
Figure 6:
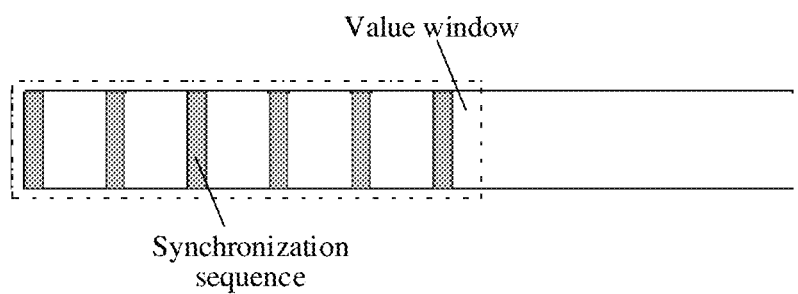
FIG. 6 is a schematic diagram of a value window according to an embodiment of this application.

For example, the encoder side may use the following block interleaving encoding manner. A process of the encoding manner is shown in FIG. 5. Interleaving with a four codeword depth is used as an example, and four FEC-encoded codewords are used as a whole. The data sequence sent at a line layer is no longer sent after the FEC encoding. Instead, data in several codewords is sent in a staggered manner. As shown in FIG. 6, interleaving encoding is performed based on a four codeword depth in FIG. 6, and blocks in FIG. 6 show data after interleaving. Each gray part represents a part of Psync that is dispersed due to the interleaving, depending on a granularity of the interleaving encoding. First, k bits in a codeword 1 are first sent (k may be 1), then k bits in a codeword 2 are sent, and then k bits in each of a codeword 3 and a codeword 4 are sent. Then the $2^{nd}$ k bits in the codeword 1 are sent, and the cycle is repeated in sequence until all the four codewords are sent. A codeword 5 to a codeword 8 are processed in the same manner until an entire frame is sent.

After the interleaving encoding is performed at the encoder side, the synchronization sequence used for delimitation is dispersed into the data flow, and the continuous synchronization sequence used for the frame delimitation is discretely distributed in the data flow due to introduction of the interleaving encoding. As shown in FIG. 6, the decoder side can no longer complete delimitation with the continuous synchronization sequence.

Figure 7:
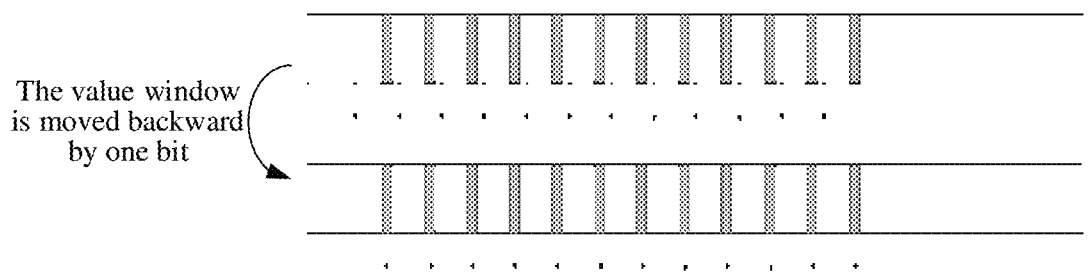
FIG. 7 is a schematic diagram of moving a value window backward by one bit according to an embodiment of this application.

To implement a boundary of the synchronization sequence in the data flow, in this embodiment of this application, the decoder side may obtain a value in a larger range by using an interleaved value manner, and implement matching between the first data information obtained by obtaining the value and a preset synchronization sequence. A specific implementation process is shown in FIG. 7. In a downlink data flow, a value of N multiplied by P is used as a value window, where P is a length of a synchronization sequence, and N is a quantity of codewords for interleaving encoding. For example, P is 64, and N is 4. In the value window, one bit is selected from every N bit based on a fixed value interval, and a total of P bits are selected, where the value interval depends on a depth of the interleaving encoding. If the depth of the interleaving encoding is four codewords, the fixed interval may be equal to four bits. In other words, one-bit data is extracted from the data flow based on every four bits, and a total of P-bit data is extracted from the data flow. A difference degree between the P-bit data and the preset synchronization sequence is obtained, in other words, the P-bit data is compared and matched with the preset synchronization sequence. It is determined, through comparison, whether the P-bit data is the same as the preset synchronization sequence. When a quantity of different bits of the two is less than m, it is considered that the two match each other. Otherwise, it is considered that the two do not match each other, where m may be 2, 3, 4, or the like.

When the extracted P-bit data does not match the preset synchronization sequence, as shown in FIG. 7, the value window is moved backward by one bit, and the preceding matching process is repeated until a matching synchronization sequence is found in the downlink data flow. After finding the matched synchronization sequence in the downlink data flow, the decoder side uses the $1^{st}$ bit in the entire value window as a start boundary of the data frame and the codeword, performs de-interleaving based on the boundary, and recovers continuous FEC codewords. Then, the FEC codewords are decoded. If the FEC codewords are successfully decoded, the decoder side may determine that the delimitation and synchronization of the downlink data flow are completed. If decoding of several continuous FEC codewords fails, in the foregoing synchronization process, incorrect matching may be caused by that a code pattern of the synchronization sequence appears by coincidence in the downlink data flow. The decoder side still needs to obtain data from the data flow by using the value window of N multiplied by P, and use a sliding window for matching verification. A sliding manner may be sliding in a direction of a newly received data flow until correct delimitation and synchronization of a downlink frame are completed.

It can be learned from the foregoing example descriptions that this embodiment of this application provides the foregoing downlink data processing procedure of the high-speed PON system, to implement the downlink synchronization delimitation of the high-speed PON system, and by introducing an interleaving solution, an associated bit error or a burst bit error that is caused by a digital equalizer in the PON system is resolved. A matching mode with the value window and the interleaved value is used to implement downlink data matching in the case of interleaving.

Figure 8:
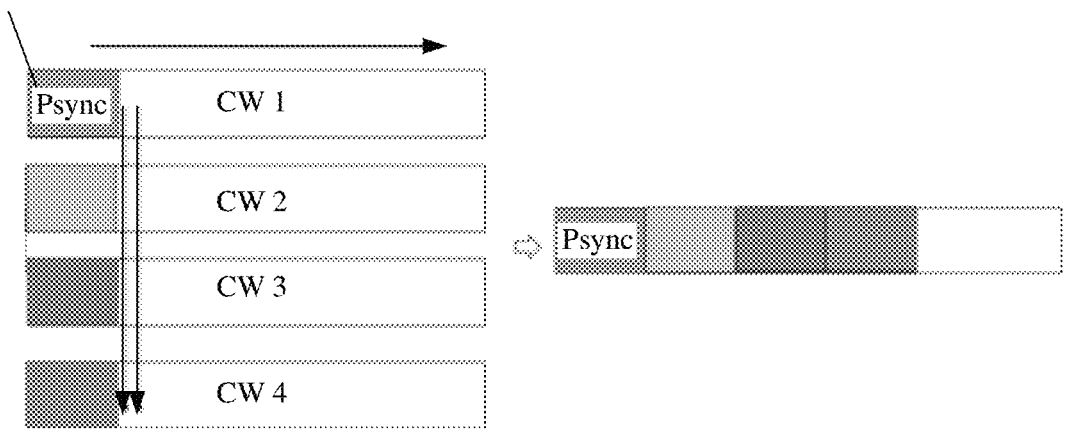
FIG. 8 is a schematic diagram in which an encoder side does not interleave synchronization information according to an embodiment of this application.

To ensure a continuous synchronization sequence, in this embodiment, the same interleaving manner as that in the foregoing embodiment is still used. However, in a start phase of each frame, an interleaving manner that is not exactly the same as that of the other parts is used. As shown in FIG. 8, synchronization information does not participate in interleaving encoding, and in an interleaving process, a synchronization sequence is retained in a sent data flow as a whole. When receiving data, the decoder side still uses a complete synchronization sequence for matching, and after the matching, completes frame delimitation. A frame boundary part uses an interleaving manner different from those of the other parts in the frame.

It should be noted that, for brief description, the foregoing method embodiments are each represented as a combination of a series of actions. However, a person skilled in the art should know that this application is not limited to the described order of the actions, because according to this application, some steps may be performed in another order or simultaneously. It should be further known by a person skilled in the art that related actions and modules of the embodiments described in this specification are not necessarily required by this application.

To better implement the foregoing solutions in embodiments of this application, the following further provides a related apparatus configured to implement the foregoing solutions.

Figure 9:
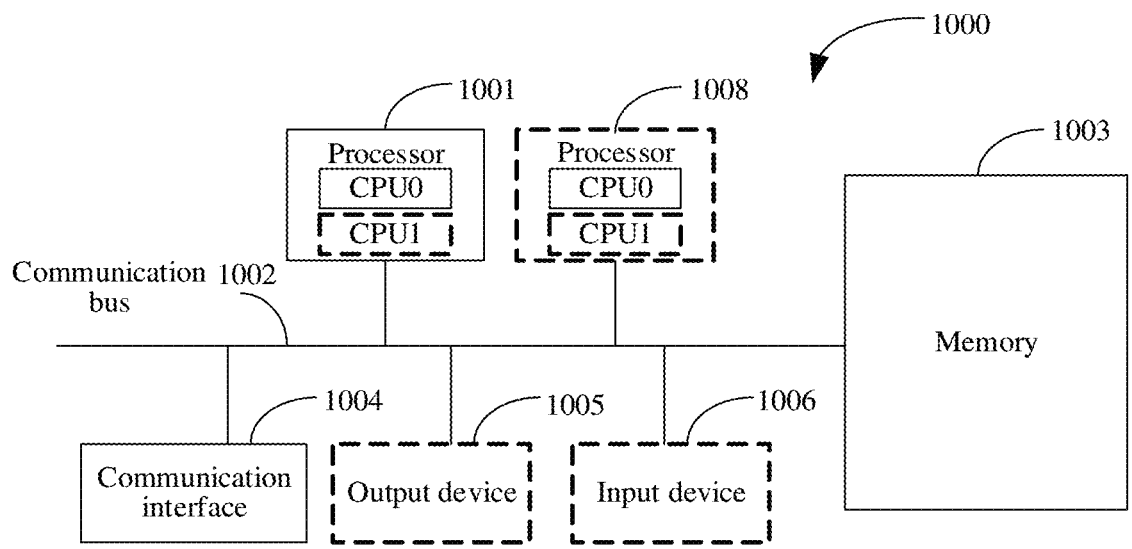
FIG. 9 is a schematic diagram of a composition structure of a data processing device according to an embodiment of this application.

For example, both the encoder side and the decoder side in the foregoing embodiments may be implemented by the apparatus shown in FIG. 9. The apparatus may be specifically a data processing device.

The apparatus 1000 includes at least one processor 1001, a communication bus 1002, a memory 1003, and at least one communication interface 1004. The apparatus 1000 may be a general-purpose computer or server or a dedicated computer or server.

The processor 1001 may be a general-purpose central processing unit (central processing unit, CPU), a microprocessor, an application-specific integrated circuit (application-specific integrated circuit, ASIC), or one or more integrated circuits configured to control execution of programs in solutions of the present invention.

The communication bus 1002 may include a path for transmitting information between the foregoing components.

The communication interface 1004 may be any transceiver, an IP port, a bus interface, or the like, and is configured to communicate with an internal or external device or apparatus, or a communication network, such as an Ethernet, a radio access network (RAN), or a wireless local area network (WLAN).

The memory 1003 may be a read-only memory (ROM) or another type of static storage device that can store static information and instructions, a random access memory (RAM) or another type of dynamic storage device that can store information and instructions, an electrically erasable programmable read-only memory (EEPROM), a compact disc read-only memory (CD-ROM) or another optical disc storage, an optical disc storage (including a compressed optical disc, a laser disc, an optical disc, a digital versatile disc, a Blu-ray disc, or the like), a magnetic disk storage medium or another magnetic storage device, or any other medium that can be configured to carry or store expected program code in a form of instructions or a data structure and that can be accessed by a computer, but is not limited thereto. The memory may exist independently, and is connected to the processor through the bus. Alternatively, the memory may be integrated with the processor.

The memory 1003 is configured to store application program code for executing the solutions of the present invention, and the processor 1001 controls the execution. The processor 1001 is configured to execute the application program code stored in the memory 1003, to implement functions of an encoder side and a decoder side in embodiments of this application.

During specific implementation, in an embodiment, the processor 1001 may include one or more CPUs, for example, a CPU 0 and a CPU 1 in FIG. 9.

During specific implementation, in an embodiment, the apparatus 1000 may include a plurality of processors such as the processor 1001 and a processor 1008 in FIG. 9. Each of the processors may be a single-core (single-CPU) processor, or may be a multi-core (multi-CPU) processor. The processor herein may refer to one or more devices, circuits, and/or processing cores configured to process data (for example, computer program instructions).

During specific implementation, in an embodiment, the apparatus 1000 may further include an output device 1005 and an input device 1006. The output device 1005 communicates with the processor 1001, and may display information in a plurality of manners. For example, the output device 1005 may be a liquid crystal display (LCD), a light emitting diode (LED) display device, a cathode ray tube (CRT) display device, or a projector. The input device 1006 communicates with the processor 1001, and may receive an input of a user in various manners. For example, the input device 1006 may be a mouse, a keyboard, a touchscreen device, or a sensing device.

When the apparatus shown in FIG. 9 is a chip, a function/implementation process of the communication interface 1004 may alternatively be implemented by using a pin, a circuit, or the like. The memory is a storage unit in the chip, for example, a register or a cache, and the storage unit may alternatively be a storage unit located outside the chip.

It should be noted that, content such as information exchange between the modules/units of the apparatus and the execution processes thereof is based on the same idea as the method embodiments of this application, and produces the same technical effects as the method embodiments of this application. For specific content, refer to the foregoing descriptions in the method embodiments of this application. Details are not described herein again.

An embodiment of this application further provides a computer storage medium. The computer storage medium stores a program, and the program performs a part or all of the steps described in the foregoing method embodiments.

In addition, it should be noted that the described apparatus embodiment is merely an example. The units described as separate parts may or may not be physically separate, and parts displayed as units may or may not be physical units, may be located in one position, or may be distributed on a plurality of network units. Some or all the modules may be selected based on actual needs to achieve objectives of the solutions of embodiments. In addition, in the accompanying drawings of the apparatus embodiment provided by this application, connection relationships between modules indicate that the modules have communication connections with each other, which may be specifically implemented as one or more communication buses or signal cables.

Based on the descriptions of the foregoing implementations, a person skilled in the art may clearly understand that this application may be implemented by software in addition to necessary universal hardware, or certainly may be implemented by dedicated hardware, including a dedicated integrated circuit, a dedicated CPU, a dedicated memory, a dedicated component, and the like. Generally, any function that can be performed by a computer program can be easily implemented by using corresponding hardware. Moreover, a specific hardware structure used to achieve a same function may be in various forms, for example, in a form of an analog circuit, a digital circuit, or a dedicated circuit. However, in this application, a software program implementation is a better implementation in most cases. Based on such an understanding, the technical solutions of this application essentially or a part contributing to a conventional technology may be implemented in a form of a software product. The computer software product is stored in a readable storage medium, such as a floppy disk, a USB flash drive, a removable hard disk, a ROM, a RAM, a magnetic disk, or an optical disc of a computer, and includes several instructions for instructing a computer device (which may be a personal computer, a server, or a network device) to perform the methods described in embodiments of this application.

All or some of the foregoing embodiments may be implemented by using software, hardware, firmware, or any combination thereof. When software is used for implementation, all or some of embodiments may be implemented in a form of a computer program product.

The computer program product includes one or more computer instructions. When the computer program instructions are loaded and executed on a computer, all or a part of the procedures or functions according to embodiments of this application are generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive (SSD)), or the like.

What is claimed is:

1. A data processing method, comprising:
receiving a data flow sent by an encoder side in a passive optical network (PON) system, wherein the data flow is a bit stream that is based on interleaving encoding of multiple forward error correction (FEC) codewords, wherein a first FEC codeword of the multiple FEC codewords comprises synchronization information, and wherein the synchronization information is distributed in the data flow based on a first permutation interval;
obtaining, from the data flow, first data information based on a first value interval and a first value length, wherein the first value interval is equal to the first permutation interval, and wherein the first value length is equal to a length of the synchronization information; and performing, in response to a similarity between the first data information and the synchronization information exceeding a preset similarity threshold, de-interleaving on the data flow based on a start location of the first data information.

2. The method according to claim 1, wherein the obtaining first data information comprises:

obtaining, from the data flow, a first data substream whose length is P×N bits, wherein P is the length of the synchronization information, wherein N is a quantity of code blocks on which the interleaving encoding is performed, and wherein the code block comprises at least one codeword; and obtaining, from the first data substream based on the first value interval and the first value length, first data information comprising P-bit data, wherein the value interval is (N−1)×k bits, wherein k is a granularity of the interleaving encoding, and wherein × represents a multiplication operation.

3. The method according to claim 2, wherein the obtaining, from the first data substream based on the first value interval and the first value length, first data information comprising P-bit data comprises:

dividing the first data substream into P/k data sets, wherein each data set comprises N×k-bit data, wherein and/represents a division operation; and obtaining k-bit data from each of the P/k data sets, wherein the first data information comprises a total of P-bit data obtained from the P/k data sets.

4. The method according to claim 2, wherein the method further comprises:

performing, in response to the similarity between the first data information and the synchronization information not exceeding the similarity threshold:

obtaining, from the data flow, a second data substream whose length is P×N bits, wherein data of at least one different bit exists in the second data substream and the first data substream; and obtaining, from the second data substream based on the first value interval and the first value length, second data information comprising P-bit data; and performing, in response to a similarity between the second data information and the synchronization information exceeding the similarity threshold:

performing de-interleaving on the data flow based on a start location of the second data information.

5. The method according to claim 1, further comprising performing, after the performing the de-interleaving on the data flow based on the start location of the first data information:

forward error correction (FEC) decoding on the data flow.

6. The method according to claim 5, further comprising performing, after using a $1^{st}$ bit as a start boundary of downlink synchronization, and after performing the FEC decoding on the data flow:

determining, in response to the FEC decoding performed on the data flow succeeding, that the $1^{st}$ bit in the first data information is the start boundary of the downlink synchronization.

7. The method according to claim 1, further comprising performing, after the performing the de-interleaving on the data flow based on the start location of the first data information:

descrambling the data flow using a preset scrambling code.

8. A data processing method, comprising:

obtaining multiple FEC codewords by performing, in a passive optical network (PON) system, forward error correction (FEC) encoding on a data block, wherein a first FEC codeword of the multiple FEC codewords comprises synchronization information;

obtaining a data flow by performing interleaving encoding on the multiple FEC codewords, wherein the synchronization information is distributed in the data flow based on a first permutation interval; and sending the data flow.

9. The method according to claim 8, wherein the performing the interleaving encoding on the multiple FEC codewords comprises:

determining N code blocks used for the interleaving encoding; and encoding the multiple FEC codewords into the N code blocks based on a granularity k of the interleaving encoding, wherein both N and k are integers greater than 0.

10. The method according to claim 9, further comprising performing, before the sending the data flow:

scrambling the data flow by using a preset scrambling code.

11. The method according to claim 8, wherein the multiple FEC codewords are 4 FEC codewords, the performing interleaving encoding on the multiple FEC codewords comprises:

putting bits 1, . . . , $S_D$ of the first FEC codeword at bit positions 1, D+1, . . . , D×$S_D$−D+1 of the data flow;

putting bits 1, . . . , $S_D$ of a second FEC codeword at bit positions 2, D+2, . . . , D×$S_D$−D+2 of the data flow;

putting bits 1, . . . , $S_D$ of a third FEC codeword at bit positions 3, D+3, . . . , D×$S_D$−D+3 of the data flow;

putting bits 1, . . . , $S_D$ of a fourth FEC codeword at bit positions 4, D+4, . . . , D×$S_D$ of the data flow, wherein D is 4, and $S_D$ is an integer greater than 1.

12. A data processing device, comprising:

at least one processor; and a communication interface;

wherein the at least one processor is configured to:

receive a data flow sent by an encoder side through the communication interface, wherein the data flow is a bit stream that is based on interleaving encoding of multiple forward error correction (FEC) codewords, wherein a first FEC codeword of the multiple FEC codewords comprises synchronization information, and wherein the synchronization information is distributed in the data flow based on a first permutation interval;

obtain, from the data flow, first data information based on a first value interval and a first value length, wherein the first value interval is equal to the first permutation interval, and wherein the first value length is equal to a length of the synchronization information; and perform, in response to a similarity between the first data information and the synchronization information exceeding a preset similarity threshold, de-interleaving on the data flow based on a start location of the first data information.

13. The data processing device according to claim 12, wherein the at least one processor is further configured to:

obtain, from the data flow, a first data substream whose length is P×N bits, wherein P is the length of the synchronization information, wherein N is a quantity of code blocks on which the interleaving encoding is performed, and wherein the code block comprises at least one codeword; and obtain, from the first data substream based on the first value interval and the first value length, first data information comprising P-bit data, wherein the value interval is (N−1)×k bits, k is a granularity of the interleaving encoding, and wherein × represents a multiplication operation.

14. The data processing device according to claim 13, wherein the at least one processor is further configured to:
divide the first data substream into P/k data sets, wherein each data set comprises N×k-bit data, and wherein/ represents a division operation; and
obtain k-bit data from each of the P/k data sets, wherein the first data information comprises a total of P-bit data obtained from the P/k data sets.

15. The data processing device according to claim 13, wherein the at least one processor is further configured to perform, in response to the similarity between the first data information and the synchronization information not exceeding the similarity threshold:
obtain, from the data flow, a second data substream whose length is P×N bits, wherein data of at least one different bit exists in the second data substream and the first data substream;
obtain, from the second data substream, based on the first value interval and the first value length, second data information comprising P-bit data; and
perform, in response to a similarity between the second data information and the synchronization information exceeding the similarity threshold, de-interleaving on the data flow based on a start location of the second data information.

16. The data processing device according to claim 12, wherein the at least one processor is configured to, after the performing the de-interleaving on the data flow based on the start location of the first data information:
perform forward error correction (FEC) decoding on the data flow.

17. The data processing device according to claim 16, wherein the at least one processor further is configured to, after using a 1st bit as a start boundary of downlink synchronization, and the performing the FEC decoding on the data flow:
determine, in response to the FEC decoding performed on the data flow succeeding, that the 1st bit in the first data information is the start boundary of the downlink synchronization.

18. The data processing device according to claim 12, wherein the at least one processor is configured to, after the performing de-interleaving on the data flow based on the start location of the first data information:
descramble the data flow by using a preset scrambling code.

19. A data processing device, comprising:
at least one processor; and
a communication interface;
wherein the at least one processor is configured to:
perform FEC encoding on a data block to obtain multiple FEC codewords, wherein a first FEC codeword of the multiple FEC codewords comprises synchronization information; and
perform interleaving encoding on the multiple FEC codewords to obtain a to-be-sent data flow, wherein the synchronization information is distributed in the data flow based on a first permutation interval; and
wherein the communication interface is configured to send the data flow.

20. The device according to claim 19, wherein the at least one processor is configured to, before sending the data flow, scramble the data flow by using a preset scrambling code.

21. The device according to claim 19, wherein the multiple FEC codewords are 4 FEC codewords, the at least one processor is configured to:
put bits $1, \ldots, S_D$ of the first FEC codeword at bit positions $1, D+1, \ldots, D \times S_D - D+1$ of the data flow, respectively;
put bits $1, \ldots, S_D$ of a second FEC codeword at bit positions $2, D+2, \ldots, D \times S_D - D+2$ of the data flow, respectively;
put bits $1, \ldots, S_D$ of a third FEC codeword at bit positions $3, D+3, \ldots, D \times S_D - D+3$ of the data flow, respectively;
put bits $1, \ldots, S_D$ of a fourth FEC codeword at bit positions $4, D+4, \ldots, D \times S_D$ of the data flow, respectively, wherein D is 4, and $S_D$ is an integer greater than 1.

* * * * *

UNITED STATES PATENT AND TRADEMARK OFFICE
CERTIFICATE OF CORRECTION

PATENT NO. : 12,294,458 B2  
APPLICATION NO. : 18/192121  
DATED : May 6, 2025  
INVENTOR(S) : Wu et al.

Page 1 of 1

It is certified that error appears in the above-identified patent and that said Letters Patent is hereby corrected as shown below:

In the Claims

In Column 25, in Claim 3, Lines 27-28, delete "wherein and/represents" and insert -- wherein and / represents --.

In Column 26, in Claim 11, Line 35, after "flow;" insert -- and --.

In Column 27, in Claim 14, Lines 12-13, delete "wherein/represents" and insert -- wherein / represents --.

In Column 27, in Claim 17, Line 42, delete "1st" and insert -- 1$^{st}$ --.

In Column 28, in Claim 17, Line 2, delete "1st" and insert -- 1$^{st}$ --.

In Column 28, in Claim 21, Line 39, after "respectively;" insert -- and --.

Signed and Sealed this  
Twenty-fourth Day of June, 2025

Coke Morgan Stewart  
*Acting Director of the United States Patent and Trademark Office*